United States Patent [19]
Glover et al.

[11] Patent Number: 6,067,867
[45] Date of Patent: May 30, 2000

[54] MINI INSTRUMENT NEEDLE INDICATOR

[75] Inventors: Alfred H. Glover, Decatur; Lawrence R. Loveday, Huntsville; Joseph T. Betterton, Arab, all of Ala.

[73] Assignee: DaimlerChrysler Corporation, Auburn Hills, Mich.

[21] Appl. No.: 09/223,332

[22] Filed: Dec. 30, 1998

[51] Int. Cl.[7] .................................................. G01R 5/16
[52] U.S. Cl. ............................................................ 73/866.3
[58] Field of Search ................................ 73/866.1, 866.3; 324/146, 151 A, 151 R, 152, 154 R, 154 PB

[56] References Cited

U.S. PATENT DOCUMENTS

| | | | |
|---|---|---|---|
| 2,450,331 | 9/1948 | De Giers et al. | 324/154 R |
| 3,471,785 | 10/1969 | Chardon | 324/154 R |
| 4,745,813 | 5/1988 | MacManus | 324/154 PB |
| 5,004,976 | 4/1991 | Markow et al. | 324/151 A |
| 5,387,860 | 2/1995 | Tsai et al. | 324/146 |
| 5,686,832 | 11/1997 | Ayres et al. | 324/146 |

*Primary Examiner*—Robert Raevis

[57] ABSTRACT

A gauge assembly is provided including a bobbin assembly disposed within a housing. A magnetic armature is rotatably supported within a sealed chamber defined by said bobbin assembly. Three independent wire coils are wrapped around the bobbin assembly within three separate coil cavities defined by the bobbin assembly.

13 Claims, 3 Drawing Sheets

MINI INSTRUMENT NEEDLE INDICATOR

BACKGROUND OF THE INVENTION

1. Field of the Invention

The present invention relates generally to a gauge assembly for use in a vehicle instrument cluster, and more particularly, to a mini gauge assembly.

2. Background and Summary of the Invention

Instrument cluster gauges, such as speedometers, tachometers, fuel and temperature gauges used in modern vehicles commonly include a pointer body or needle coupled to a permanent magnet. The magnet is generally carried in a plastic housing or bobbin, which is wrapped with two wire coils. During operation of the vehicle, current flowing through the coils creates a magnetic field, and the magnet rotates within the housing to align itself in force balance relationship with the magnetic field. Since the pointer body rotates with the magnet, positioning of the pointer body is controlled by the direction and magnitude of the current in the coils. To provide for steady movement of the pointer body, a viscous fluid is carried in the housing to damp the rotational movement of the magnet.

Current gauge assembly designs include a first inner wire coil that wraps around the bobbin in a first direction and a second outer wire coil that overlaps the first inner wire coil in a transverse direction. The inner coil is closer to the magnet mounted within the bobbin than the outer coil. Accordingly, the inner and outer coils are strategically wound to equalize the magnetic field generated by each coil. Specifically, with these gauge assemblies, the first inner wire coil is initially wound about the bobbin a first predetermined number of times and is then reverse wound a second predetermined number of times in order to reduce the field created by the first coil in order to equalize the field created by the closer inner coil and the distal outer coil. Due to the overlapping coils and the additional windings necessary to equalize the magnetic field of each coil, the size of the conventional gauge assemblies is larger than desired. Furthermore, because the coils are located far away from the magnet, the torque obtained from the conventional gauge designs is limited. Typical gauges of the above described design are disclosed in U.S. Pat. Nos. 5,219,135 and 5,631,419.

Accordingly, it is an object of the present invention to provide a gauge assembly, including a housing and a bobbin assembly including first and second bobbin elements which engage one another to define a generally cylindrical sealed chamber. An armature is supported within the chamber by a spindle which extends through an opening in one of the first and second bobbin elements. Three wire coils are wound over the bobbin assembly and are each provided with two ends each terminating at a respective terminal. The wire coils are disposed at 120° angles to each other and do not overlap one another. The bobbin assembly includes three coil cavities for receiving the three wire coils. The first and second bobbin elements are identical to one another.

Further areas of applicability of the present invention will become apparent from the detailed description provided hereinafter. It should be understood however that the detailed description and specific examples, while indicating preferred embodiments of the invention, are intended for purposes of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
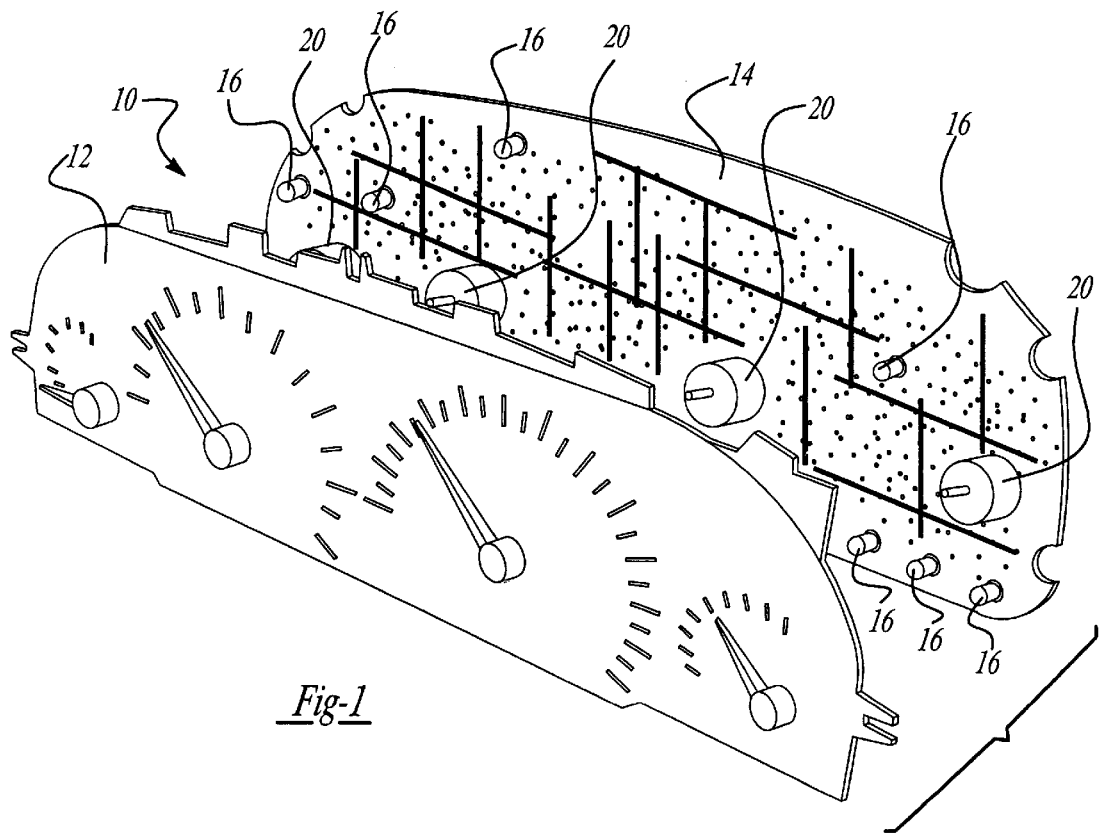
FIG. 1 is a perspective view of an instrument cluster including a display panel and a printed circuit board according to the principles of the present invention.

With reference to the accompanying figures, the gauge assembly of the present invention will now be described. FIG. 1 illustrates an instrument cluster 10 including a display panel 12 and printed circuit board 14. The printed circuit board 14 includes a plurality of circuit elements which are standard for many instrument cluster printed circuit boards. A plurality of light bulbs 16 are mounted to the printed circuit board for providing light to the display panel 12 using known illumination techniques. A plurality of gauge assemblies 20 according to the principles of the present invention are mounted to the printed circuit board 14 and to the display panel 12 in a manner that will be described herein.

Figure 5:
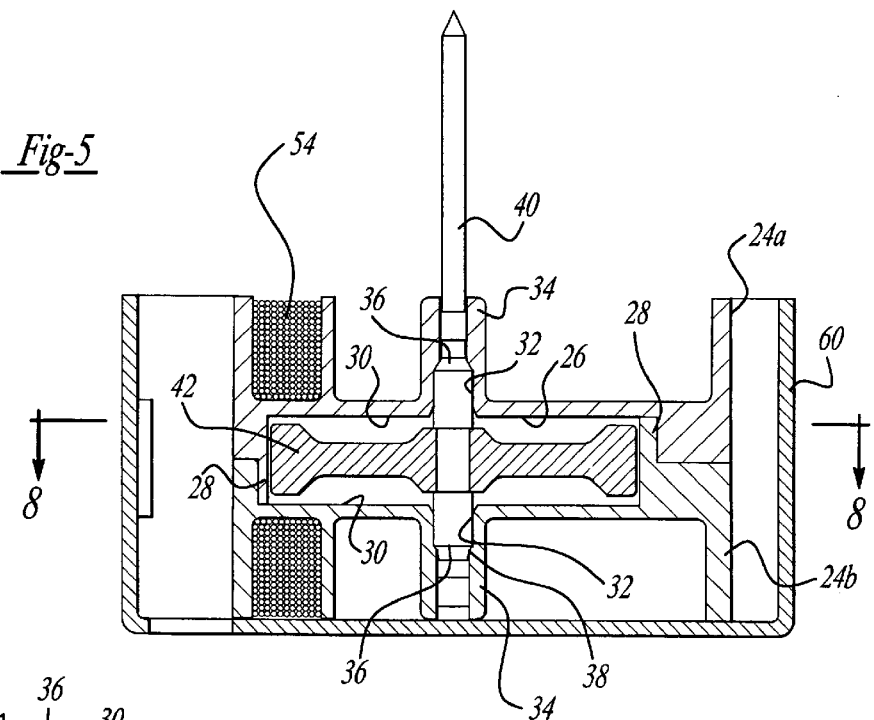
FIG. 5 is a cross-sectional view of the gauge assembly according to the principles of the present invention.

The gauge assembly 20 will now be described with reference to FIGS. 2–8. The gauge assembly 20 includes a bobbin assembly 22, best shown in FIGS. 3 and 4. The bobbin assembly 22 includes first and second bobbin halves 24a, 24b which are asymmetrical and can be used interchangeably. The bobbin halves 24a, 24b combine to define a generally cylindrical sealed chamber 26, as best shown in the cross-sectional view of FIG. 5. The sealed chamber 26 is defined by sidewall half sections 28 of the first and second bobbin halves 24a, 24b which combine to define the entire peripheral wall section of the sealed chamber 26. The first and second internal face surfaces 30 of the sealed chamber 26 are each provided with a spindle hole 32 in the center thereof. The spindle hole 32 extends through a shaft boss portion 34. The spindle hole 32 is provided with a shoulder portion 36 which is engaged by a shoulder portion 38 of a spindle shaft 40 as shown in FIG. 5. A magnetic disk-shaped armature 42 is mounted to the spindle shaft 40 within the sealed cavity 26 as shown in FIG. 5.

Figure 2:
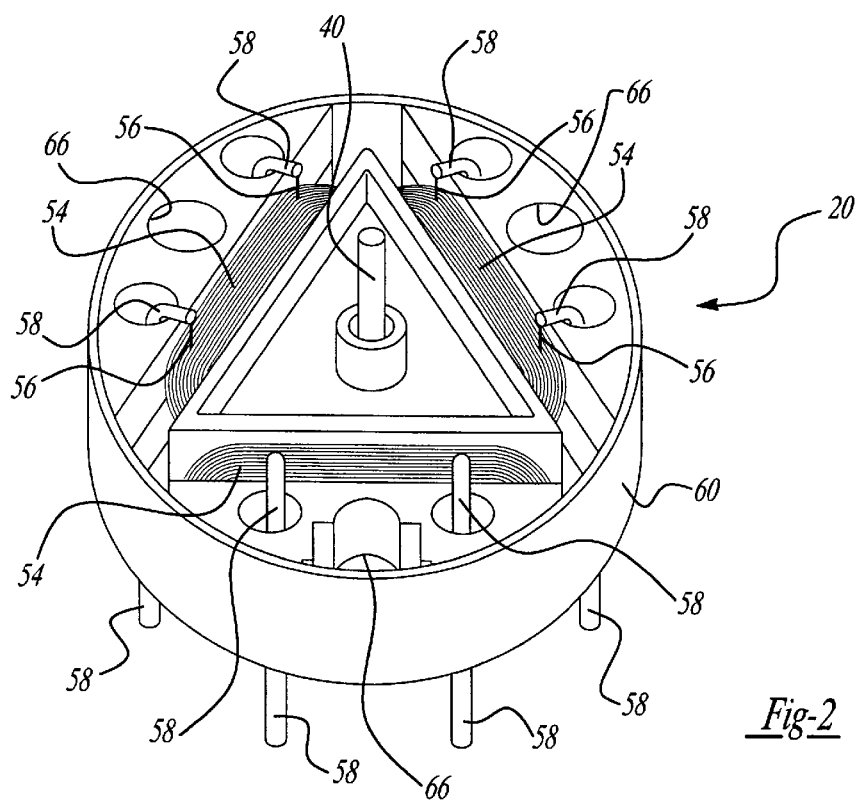
FIG. 2 is a perspective view of a gauge assembly according to the principles of the present invention.
Figure 3:
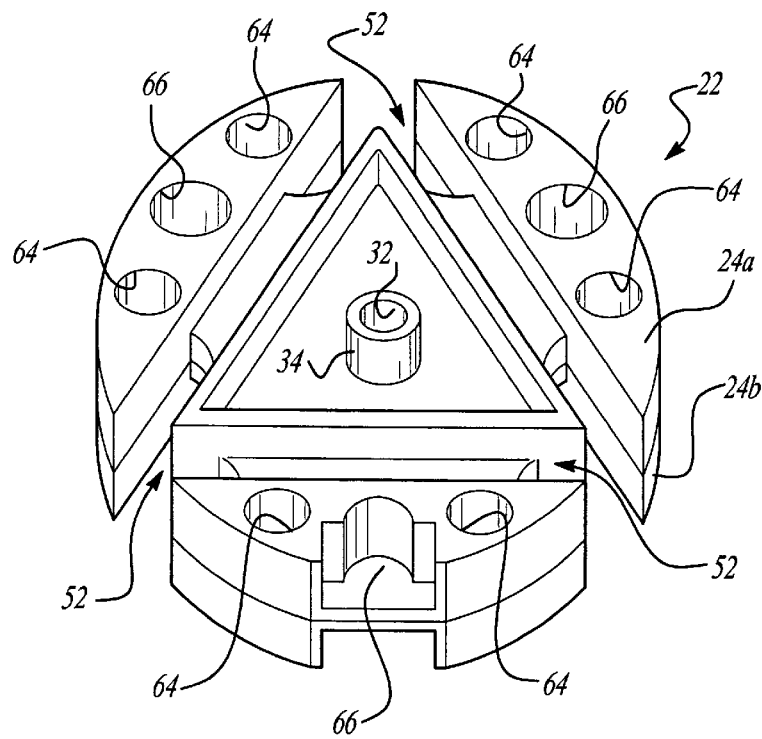
FIG. 3 is a perspective view of the bobbin assembly of the gauge according to the principles of the present invention.
Figure 4:
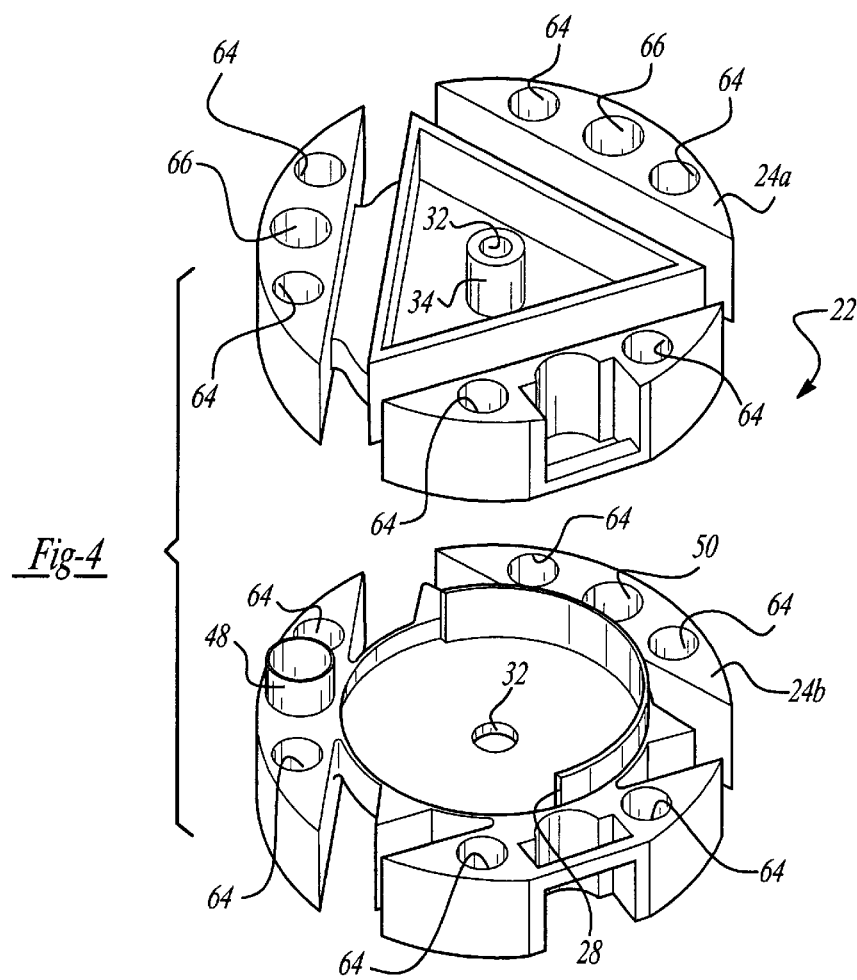
FIG. 4 is an exploded perspective view of the bobbin halves of the bobbin assembly according to the principles of the present invention.

Each bobbin half 24a, 24b is provided with an alignment pin 48 and with an alignment hole 50 such that the alignment pin 48 on each bobbin half 24a, 24b engages the alignment hole 50 on the opposing bobbin half 24a, 24b. The first and second bobbin halves 24a, 24b combine to define three coil cavities 52 which are angularly disposed at 120° relative to one another to define an equilateral triangle. The coil cavities 52 each receive a wire coil 54 which is wound over the bobbin halves 24a, 24b. The coil ends 56 of each of the three wire coils 54 are terminated at terminal pins 58 located in the bobbin halves 24a, 24b, as shown in FIG. 2. A metal housing or can 60 is then placed over the assembly and can be secured in place by crimping as is known in the art.

The terminals 58 extend through terminal pin holes 64 provided in the bobbin halves 24a, 24b. The bobbin assembly 22 is provided with three assembly holes 66 which are capable of receiving a fastener therethrough for mounting the gauge assembly 20 to the display panel 12 of an instrument cluster 10.

With the gauge assembly design of the present invention, the gauge 20 can be made smaller, more economical, and can provide higher torque than current gauge designs. The coils 54 are each wound in close proximity to the armature 42 over the tangent point which sweeps through the centroid of the coils 54 where the magnetic force is the highest. The gauge assembly 20 has identical bobbin halves 24a, 24b that are asymmetrical and at the same time can be used interchangeably. The coil terminal pins 58 are used to communicate with the printed circuit board 14 or other driver circuit as is known in the art. The driver circuit provides the response to the sensor and provides the correct electrical input to the terminals 58 so that the gauge 20 displays the correct visual indication of the needle which is mounted to the spindle shaft 40. The gauge assembly can be soldered or mounted to the instrument cluster 10 with screws through the mounting holes 66.

Each coil 54 is wound identically on the same winder with the same number of turns and wire size. The armature 42 cross-section is designed to follow the magnetic flux lines passing through it which will minimize the need for expensive magnetic material. The gauge can 60 is of thickness to meet the electromagnetic field shielding needs.

Figure 6:
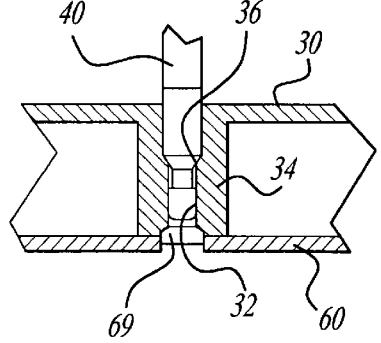
FIG. 6 illustrates a plug seal provided for plugging a shaft opening in one of the bobbin halves.
Figure 7:
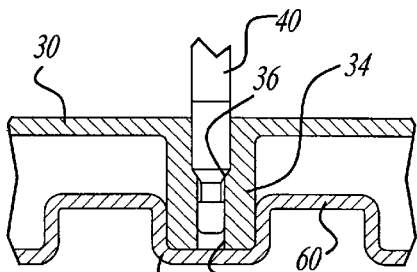
FIG. 7 illustrates an interference seal utilized for plugging one of the shaft openings in one of the bobbin halves.
Figure 8:
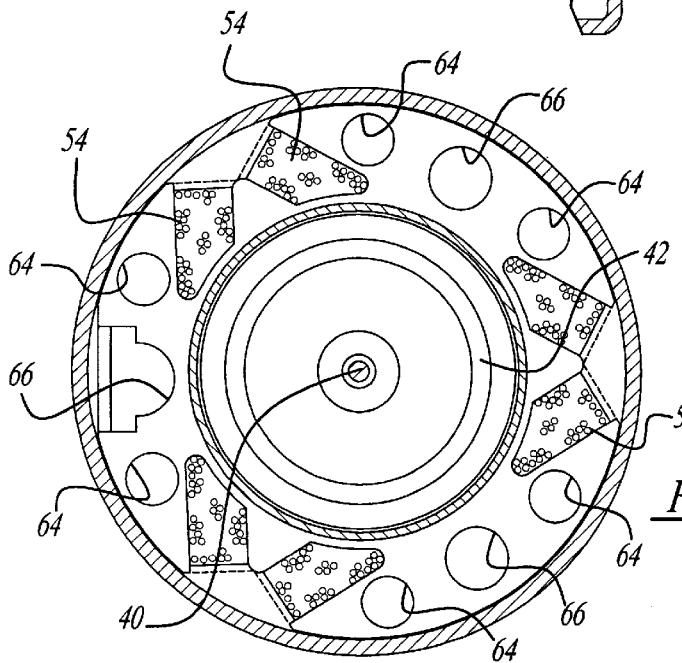
FIG. 8 is a plan view of the gauge assembly according to the principles of the present invention.

Since two spindle holes 32 are provided, and only one spindle hole is plugged via the rotating shaft or spindle 40, the second spindle hole can be used to introduce viscus dampening fluid into the sealed chamber 26 and the hole can be sealed such as by ultrasonic sealing, a sealant applied to close the unused hole 32, a thin cover or tape over the hole, or a break-away plug which is inserted into the spindle hole 32. As shown in FIG. 6, a plug seal can also be used, or as shown in FIG. 7, an interference seal 70 can be used. Because of the interchangeable bobbin halves 24a, 24b, the production cost for the gauge assembly 20 of the present invention is greatly reduced. Furthermore, the gauge assembly 20 can be utilized as a stepper motor, for example, for turning an odometer roll of a speedometer.

Because of the smaller package size, the cluster space requirements could be minimized. Furthermore, the gauge assembly 20 of the present invention utilizes few parts and provides a more positive control over needle deflection.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A gauge assembly, comprising:
    a housing;
    a bobbin assembly having three coil cavities defining an equilateral triangle supported within said housing, said bobbin assembly including first and second bobbin elements which engage one another to define a generally cylindrical sealed chamber;
    an armature supported within said chamber by a spindle which extends through an opening in one of said first and second bobbin elements wherein a tangent point of said armature is located at a centroid of each of said coils; and
    three wire coils wound over said bobbin assembly, each wire coil having two ends each terminating at respective terminals.

2. The gauge assembly according to claim 1, wherein said first and second bobbin elements are identical to one another.

3. The gauge assembly according to claim 1, wherein each of said three wire coils are equally spaced from said armature.

4. The gauge assembly according to claim 1, wherein each of said three wire coils have an equal number of windings.

5. A gauge assembly, comprising:
    a housing;
    a bobbin assembly supported within said housing including first and second bobbin elements which engage one another to define a generally cylindrical sealed chamber;
    an armature supported within said sealed chamber by a spindle which extends through an opening in one of said first and second bobbin elements;
    said first and second bobbin elements each including three complementary coil cavities each arranged at approximately 120° relative to one another; and
    a wire coil provided in each of said coil cavities.

6. The gauge assembly according to claim 5, wherein said first and second bobbin elements are identical to one another.

7. The gauge assembly according to claim 5, wherein a tangent point of said armature is located at a centroid of each of said coils.

8. The gauge assembly according to claim 5, wherein each of said three wire coils are equally spaced from said armature.

9. The gauge assembly according to claim 1, wherein each of said three wire coils have an equal number of windings.

10. A gauge assembly comprising:
    a bobbin assembly which defines a generally cylindrical sealed chamber;
    an armature supported within said sealed chamber by a spindle which extends through an opening in said bobbin assembly; and
    three wire coils independently wrapped around said bobbin assembly wherein a tangent point of said armature is located at a centroid of said coils.

11. The gauge assembly according to claim 10, wherein each of said three wire coils are equally spaced from said armature.

12. The gauge assembly according to claim 10, wherein each of said three wire coils have an equal number of windings.

13. A gauge assembly comprising:
    a bobbin assembly which defines a generally cylindrical sealed chamber, wherein said bobbin assembly includes three cavities which define an equilateral triangle;
    an armature supported within said sealed chamber by a spindle which extends through an opening in said bobbin assembly; and
    three wire coils independently wrapped around said bobbin assembly wherein the tangent point of said armature is located at a centroid of said coils.

* * * * *